(12) United States Patent
Feldtkeller

(10) Patent No.: US 7,825,764 B2
(45) Date of Patent: Nov. 2, 2010

(54) SIGNAL TRANSMITTER AND SIGNAL TRANSMISSION APPARATUS

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 579 days.

(21) Appl. No.: 11/800,717

(22) Filed: May 7, 2007

(65) Prior Publication Data

US 2008/0290976 A1 Nov. 27, 2008

(30) Foreign Application Priority Data

May 8, 2006 (EP) .................................. 06009474

(51) Int. Cl.
- *H01F 5/00* (2006.01)
- *H01F 21/02* (2006.01)
- *H01F 27/28* (2006.01)
- *H01F 27/29* (2006.01)
- *H02M 3/335* (2006.01)

(52) U.S. Cl. ................. 336/200; 336/147; 336/170; 336/180; 336/183; 336/192; 336/223; 336/232; 363/21

(58) Field of Classification Search ............. None
See application file for complete search history.

(56) References Cited

U.S. PATENT DOCUMENTS

| | | | | |
|---|---|---|---|---|
| 4,367,450 A | * | 1/1983 | Carillo | 336/200 |
| 5,063,489 A | * | 11/1991 | Inaba | 363/21.05 |
| 5,831,837 A | * | 11/1998 | Coyne et al. | 363/21.08 |
| 6,411,119 B1 | * | 6/2002 | Feldtkeller | 324/771 |
| 7,489,220 B2 | * | 2/2009 | Baumgartner et al. | 336/200 |
| 2002/0130753 A1 | * | 9/2002 | Merriam et al. | 336/223 |
| 2003/0222750 A1 | | 12/2003 | Kyriazidou | |
| 2004/0070481 A1 | | 4/2004 | Patel et al. | |
| 2006/0028313 A1 | * | 2/2006 | Strzalkowski et al. | 336/223 |
| 2006/0269002 A1 | | 11/2006 | Feldtkeller | |

FOREIGN PATENT DOCUMENTS

| | | |
|---|---|---|
| DE | 101 00 282 | 7/2002 |
| DE | 102 32 642 | 2/2004 |
| DE | 10 2004 039 218 | 3/2006 |
| DE | 10 2004 036139 | 3/2006 |

* cited by examiner

*Primary Examiner*—Lincoln Donovan
*Assistant Examiner*—Mangtin Lian
(74) *Attorney, Agent, or Firm*—Maginot, Moore & Beck

(57) ABSTRACT

Disclosed is a signal transmitter including a primary winding, a first and at least one second secondary winding which are arranged at a distance from the primary winding in a first direction and are in each case inductively coupled to the primary winding, and each of which has at least two series-connected winding sections, with the at least two winding sections of each of the first and second secondary windings being arranged in at least two different winding levels, and a signal transmission apparatus having a signal transmitter such as this.

23 Claims, 10 Drawing Sheets

A-A

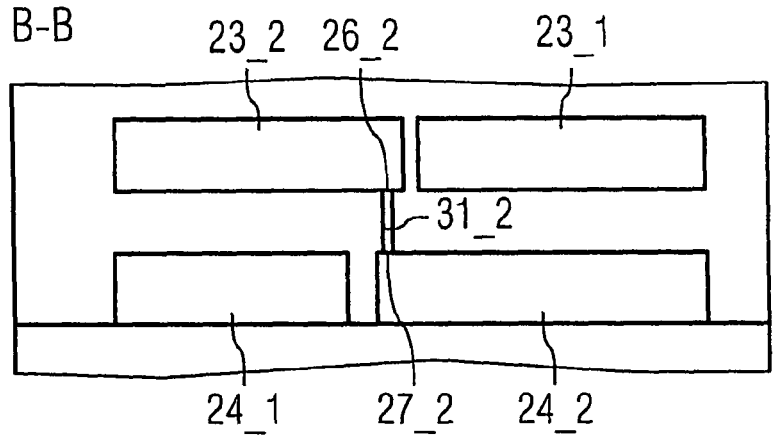
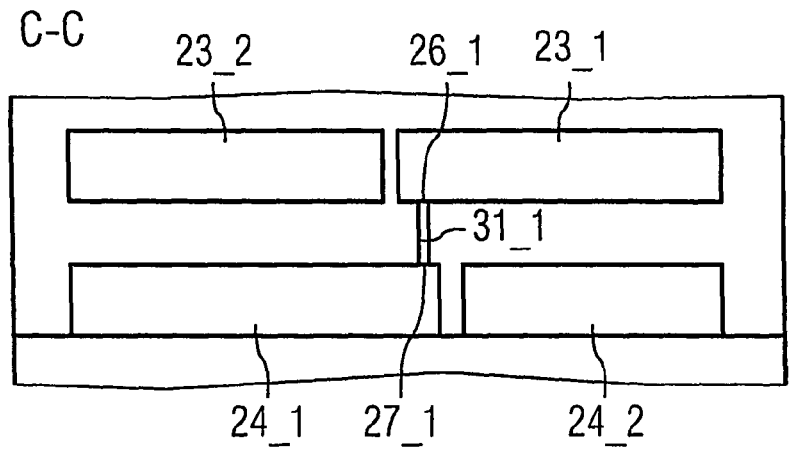
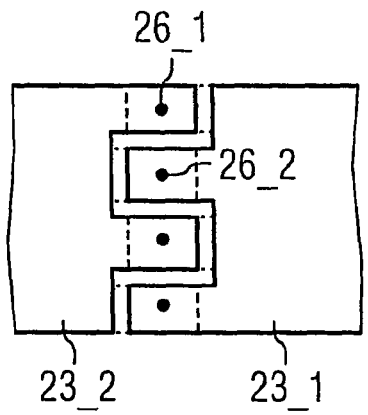

D-D

E-E

SIGNAL TRANSMITTER AND SIGNAL TRANSMISSION APPARATUS

CROSS-REFERENCE TO RELATED APPLICATIONS

The present application claims priority from European patent application number 06 009 474.5-1231, filed May 8, 2006.

FIELD

The present invention relates to a signal transmitter having a primary winding and having a secondary winding, which is inductively coupled to the primary winding, and to a signal transmission apparatus having a signal transmitter of that kind.

BACKGROUND

The primary winding and the secondary winding of such a signal transmitter form a transformer which allows signal transmission between two galvanically decoupled circuits.

The disclosure herein relates in particular to signal transmitters for galvanically decoupled signal transmission which can be produced using the conventional methods from semiconductor technology on a silicon chip. These signal transmitters are normally formed by a plurality of planar coils located one above the other and do not have any ferromagnetic core to increase the inductive coupling between primary and secondary windings. These transformers are also referred to as "coreless transformers".

It is hard to avoid parasitic capacitive coupling between the primary winding and the secondary winding of a signal transmitter. When a rapid change occurs in a voltage which is applied between the primary winding and the secondary winding —for example as a result of a reference-ground potential on the secondary side rising quickly with respect to a reference-ground potential on the primary side—then capacitive displacement currents can occur between the primary side and the secondary side. Such displacement currents induce voltages in line resistances, which are unavoidably present, in the primary and secondary windings, and in stray inductances, with these voltages being superimposed on the useful signals to be transmitted.

SUMMARY

A signal transmitter according to at least one embodiment of the invention comprises a primary winding and a first and at least one second secondary winding which are arranged at a distance from the primary winding in a first direction and are in each case inductively coupled to the primary winding, and each of which has at least two series-connected winding sections. The at least two winding sections of each of the first and second secondary windings are in this case arranged in at least two different winding levels.

In this signal transmitter, two secondary windings are provided in a space-saving manner in only two winding levels. These secondary windings may be arranged symmetrically with respect to one another, such that they are capacitively and inductively coupled to the primary winding in the same manner. When the primary winding is excited during operation of the signal transmitter, identical voltages are then induced in the two secondary windings, because the two secondary windings are coupled to the primary winding in the same way.

In order to obtain a symmetrical arrangement of the two secondary windings, the at least two winding sections of one secondary winding may be arranged offset with respect to one another in a second direction, which runs perpendicular to the first direction, in the at least two winding levels.

One example of the signal transmitter comprises a first stack of winding sections, which has winding sections of the first and second secondary winding alternately in the first direction, starting from the primary winding, and a second stack of winding sections, which has winding sections of the second and first secondary windings alternately in the first direction, starting from the primary winding. In this case, the first stack is arranged adjacent to the second stack in the second direction.

Furthermore, the two secondary windings may be connected to a common reference-ground potential terminal.

BRIEF DESCRIPTION OF THE DRAWINGS

Exemplary embodiments of the present invention will be explained in more detail in the following with reference to FIGS. 1-6.

Unless stated otherwise, identical reference symbols in the figures denote identical components and signals with the same meaning.

DETAILED DESCRIPTION

One example of a signal transmitter according to at least one embodiment of the invention is illustrated in FIGS. 1A to 1F, which show the transmitter in various cross sections.

Figure 1A:
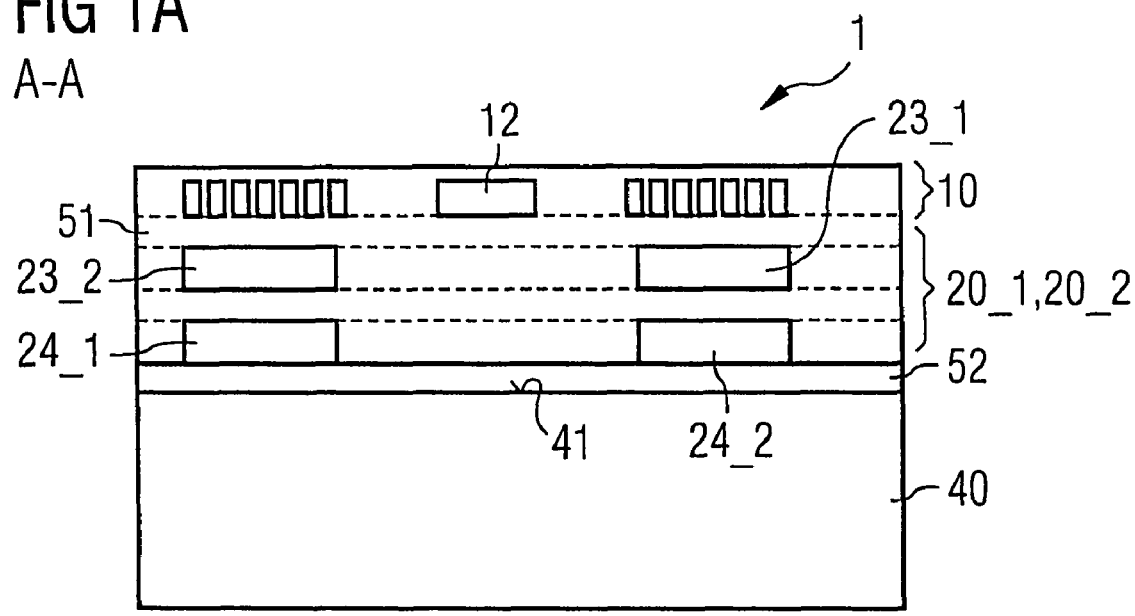
FIG. 1 shows a first example of a signal transmitter according to at least one embodiment of the invention, which has a primary winding and a secondary winding, illustrated in the form of various section views.

FIG. 1A shows a cross section in a section plane A-A of the signal transmitter. The signal transmitter comprises a primary winding 10 and two secondary windings 20_1, 20_2. The second windings 20_1, 20_2 are dielectrically isolated from the primary winding 10 and from one another by a dielectric layer 51.

The primary winding 10 and the secondary windings 20_1, 20_2 are arranged above a carrier substrate 40, with the secondary windings 20_1, 20_2 in the example being arranged between the substrate 40 and the primary winding 10. The carrier substrate 40 is, for example, a semiconductor substrate in which signal processing circuits for the processing of signals to be fed into the transmitter from the primary side or signals received on the secondary side can be integrated, in a manner which is not illustrated in detail.

Figure 1B:
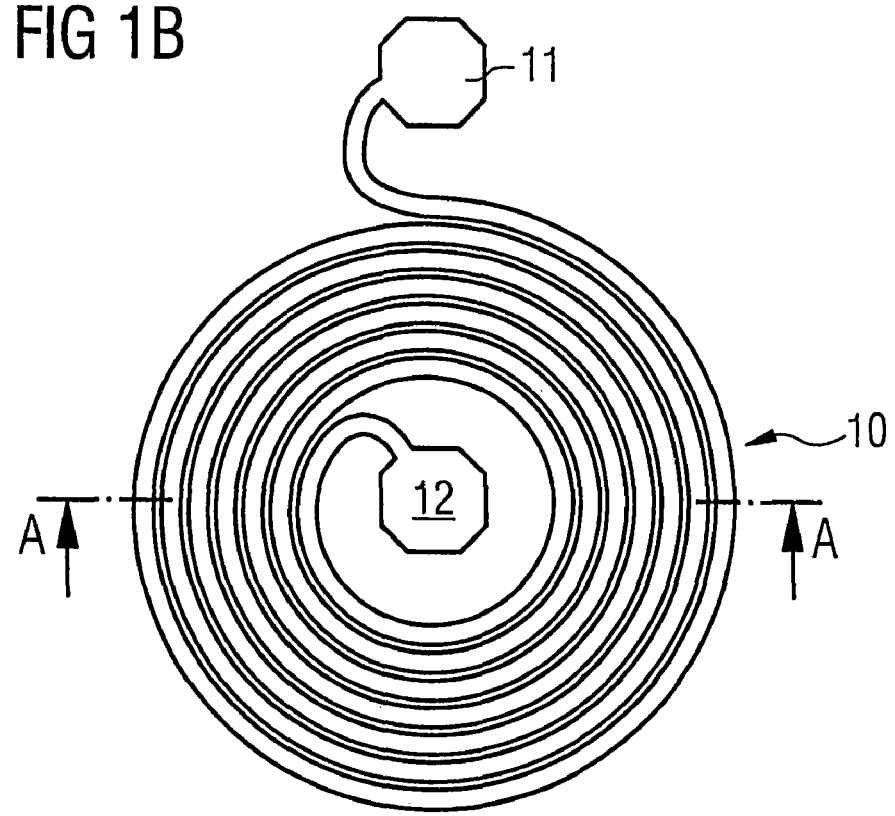

The primary winding 10, a plan view of which is illustrated in FIG. 1B, is in the form of a planar winding with a plurality of turns. In this case, the expression a planar winding means a winding whose turns are arranged in a single level, which is referred to as a winding level in the following. The winding level of the primary winding in the example is a level which runs parallel to a front face (41 in FIG. 1) of the substrate 40.

The primary winding 10 and the secondary windings 20_1, 20_2, which will be explained later, are arranged in so-called "metalization levels" above the substrate in the example. Such metalization levels are layers within an isolation or dielectric layer, within which connection lines composed of a conductive material, for example of a metal or of a heavily doped polysilicon, may be provided such conductive materials are referred to as "metalization" in the following, without any restriction to generality.

The primary winding 10 comprises a conductor which runs in a spiral shape in one metalization level and can be produced by means of the same processes as those used to produce connection lines in metalization levels for a semiconductor component. The primary winding metalization may in this case be thicker than the thickness of the secondary winding metalization.

The primary winding has a first terminal 11 and a second terminal 12. The first terminal 11 is arranged in the winding level of the primary winding outside the spiral winding profile of the primary winding, while the second terminal 12 is arranged within this spiral winding profile.

The two secondary windings 20_1, 20_2 in the signal transmitter are each formed from a plurality of winding sections, in the example in each case from two winding sections 23_1, 23_2, 24_1, 24_2, which are arranged in different winding levels. The reference symbols of the winding sections in the first secondary winding 20_1 are distinguished in the following text by the suffix _1 from the winding sections of the second secondary winding 20_2, which are identified by _2.

In the signal transmitter illustrated in FIG. 1, the two secondary windings together comprise four winding sections 23_1, 23_2, 24_1, 24_2, which are arranged in pairs in two winding levels arranged adjacent to one another. A first pair of winding sections 23_1, 23_2 is arranged in a first winding level, which is directly adjacent to the winding level of the primary winding 10 in a first direction. In the example, the first direction corresponds to a vertical direction of the substrate. A further pair of winding sections 24_1, 24_2 is arranged adjacent to the first pair of winding sections 23_1, 23_2 in this first direction, in a second winding level. This further pair of winding sections 24_1, 24_2 is isolated from the semiconductor substrate 40 by an optionally provided dielectric layer 52.

Figure 1C:
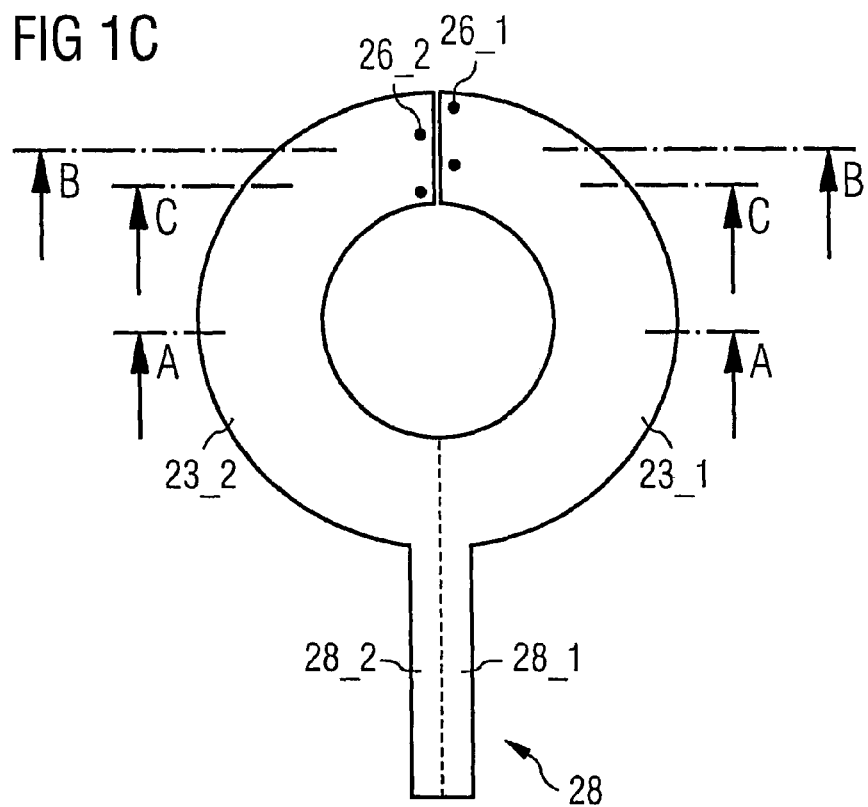
Figure 1D:
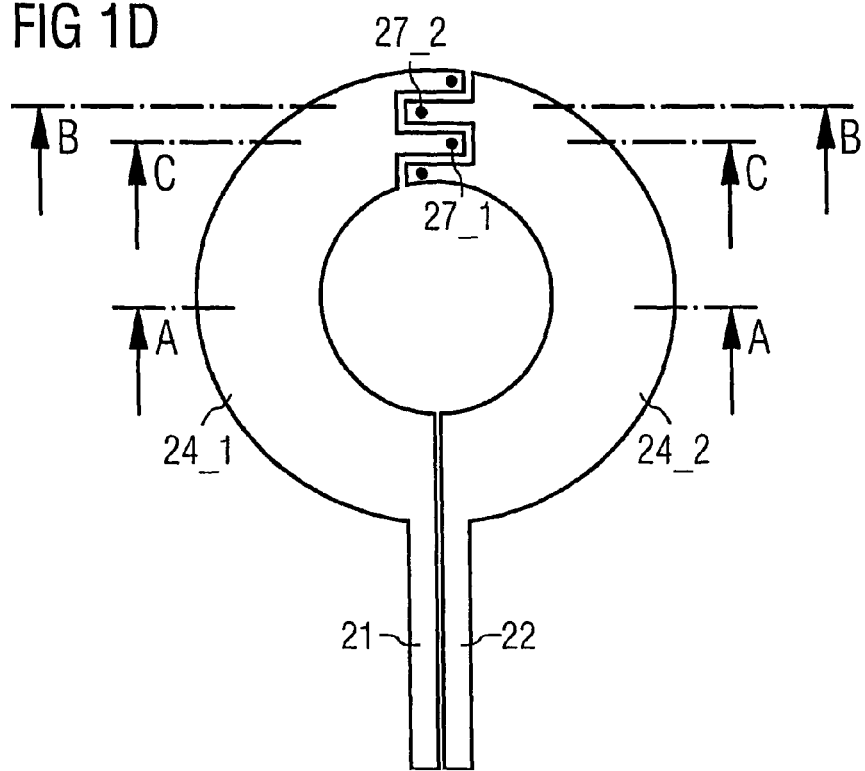

The first pair of winding sections 23_1, 23_2 is illustrated in the form of a plan view in FIG. 1C, and the second pair of winding sections 24_1, 24_2 is illustrated in the form of a plan view in FIG. 1D. The winding sections of one pair are arranged adjacent to one another in a second direction, which runs at right angles to the first direction and in the example corresponds to a horizontal direction of the substrate. The individual winding sections 23_1-24_2 are in each case in the form of annular segments with an angle of 180°, and each form half a turn of the respective secondary winding 20_1, 20_2. The two winding sections 23_1, 23_2 and 24_1, 24_2 which are arranged in one winding level in this case complement one another to form in each case one circular ring with two ring halves or annular segments.

The individual winding sections 23_1-24_2 are arranged such that two winding sections are in each case arranged aligned one above the other in the first direction. The circular rings formed by the winding sections of one winding level, and the primary winding 10, are each arranged one above the other in the first direction. The dimensions of a circular ring which is formed by a winding section pair in the second direction correspond approximately to the dimensions of the primary winding 10. This is the same as saying that the primary winding 10 largely covers the circular rings which are formed by the individual winding section pairs.

Each of the two secondary windings 20_1, 20_2 has a first and a second winding section, which are connected in series and in the example are chosen such that each of the secondary windings 20_1, 20_2 has one turn. The first secondary winding 20_1 is formed by the winding section 23_1 in the first winding level, and the winding section 24_1 in the second winding level located underneath this. The two winding sections 23_1, 24_1 are arranged offset with respect to one another in the second direction, and complement one another to form a circular ring with two ring halves, which are offset with respect to one another in the first direction, with this circular ring forming the first secondary winding 20_1.

The second secondary winding 20_2 is formed by the winding section 23_2 in the first winding level and the winding section 24_2 in the second winding level located underneath it. These two winding sections 23_2, 24_2 are arranged offset with respect to one another in the second direction and complement one another to form a circular ring with two ring halves, which are offset with respect to one another in the first direction, with the circular ring forming the second secondary winding 20_2.

The first and the second secondary winding 20_1, 20_2 in the case of the transmitter illustrated in FIG. 1 have a common reference-ground potential terminal 28. The two winding sections 23_1, 23_2 which are arranged in the first winding level are in this case integrally connected to one another at one end in the area of the reference-ground potential terminal 28. The two winding sections 23_1, 23_2 are separated from one another at the respective other end by a gap in which a part of the dielectric layer 51 is arranged.

As indicated schematically by the dashed line in FIG. 1C, it is, of course, also possible for the two winding sections 23_1, 23_2 to be completely isolated from one another and for a separate reference-ground potential terminal 28_1, 28_2 to be provided for each of these winding sections 23_1, 23_2.

At the end remote from the reference-ground potential terminal 28, the winding sections 23_1, 23_2 each have at least one terminal 26_1, 26_2. The winding sections 23_1, 23_2 in the first winding level are connected via these terminals 26_1, 26_2 and via further connection lines 31_1, 31_2 to the respectively associated winding section 24_1, 24_2 in the second winding level. These vertical line connections are illustrated in FIGS. 1E and 1F, which show cross sections through the signal transmitter on the second planes B-B and C-C in the area of the terminals 26_1, 26_2.

The vertical connection lines 31_1, 31_2 are connected to corresponding terminals 27_1, 27_2 of the winding sections 24_1, 24_2 in the second winding level. These winding sections 24_1, 24_2 each have toothed structures in the area of the terminals 27_1, 27_2, which toothed structures engage in one another and are designed such that the toothed structure of the winding section 24_1 extends in the second direction to underneath the associated winding section 23_1 of the first winding section pair in the first winding level, and such that the toothed structure of the winding section 24_2 extends in the second direction to underneath the associated winding section 23_2 of the first winding section pair in the first winding level.

In the example shown in the figure, the winding sections 24_1, 24_2 in the second winding level 24 have toothed structures, while the edges of the winding sections 23_1, 23_2 in the first winding level 23 run in straight lines. This arrangement may, of course, be interchanged such that the winding sections in the first winding level have toothed structures in a manner which is not illustrated in any more detail, while the edges of the winding sections in the second winding level run in straight lines.

Furthermore, with reference to the alternative illustrated in FIG. 1G, both the winding sections in the first winding level 23 and the winding sections in the second winding level 24 may have tooth-like structures. The toothed structure in the first winding level 23, a plan view of which is illustrated in FIG. 1G, is in this case arranged offset with respect to the toothed structure in the second winding level 24 such that the teeth of a winding section in one level overlap the teeth of the winding section in the other level, which is in each case arranged with an offset. The position of the teeth in the toothed structure in the second winding level is shown by dots in FIG. 1G. The connecting contacts 26_1, 26_2 in this alternative can be arranged on a straight line.

The two secondary windings 20_1, 20_2 which each have two winding sections 23_1, 24_1 and 23_2, 24_2, respectively, connected in series and arranged offset with respect to one another are designed to be completely symmetrical with respect to the primary winding 10, so that the two primary windings 20_1, 20_2 are coupled to the primary winding 10 in identical conditions. This relates not only to the inductive coupling, as is desired for signal transmission, between the two secondary windings 20_1, 20_2 and the primary winding 10, but also to the unavoidable capacitive coupling between the primary winding 10 and the two secondary windings 20_1, 20_2.

In the illustrated example, the two secondary windings with the reference-ground potential terminal 28 have a common terminal, and each have an additional output terminal 21, 22. These output terminals 21, 22 are arranged on the winding sections 24_1, 24_2 in the second winding level and ends which are opposite the ends of the terminals 27_1, 27_2.

Figure 2:
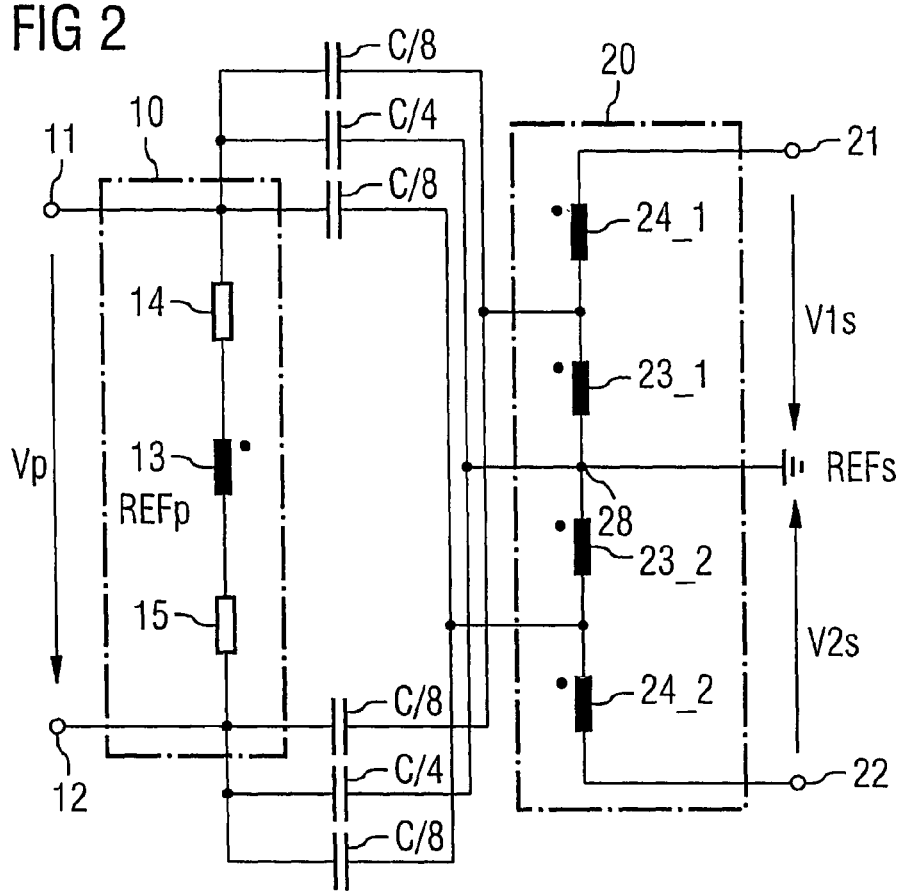
FIG. 2 shows the electrical equivalent circuit of the signal transmitter of FIG. 1.

The electrical equivalent circuit of the signal transmitter that is being explained above with reference to FIG. 1 is illustrated in FIG. 2. The equivalent circuit of the primary winding 10 has an inductance 13 which represents the inductance of the primary winding 10, as well as two resistances 14, 15 which are arranged symmetrically around the inductance 13 and represent the unavoidable track resistances of the primary winding 10.

For clarity reasons, FIG. 2 does not illustrate the track resistances of the individual winding sections of the secondary winding 20. The secondary winding 20 comprises four inductances, which are annotated in FIG. 2 in a corresponding manner to the winding sections 23_1-24_2 from which they are formed. Of these inductances, two are in each case connected in series between the reference-ground potential terminal 28 and one of the output terminals 21, 22. The parasitic capacitive coupling between the secondary winding 20 and the primary winding 10 is represented in FIG. 2 by capacitances which each act between the terminals 11, 12 of the primary winding 10 and the terminals between the individual inductances. It is assumed that the total value of a coupling capacitance of the primary winding 10 and of the secondary winding 20 corresponds to a value C. The components of this total capacitance which act between the terminals 11, 12 of the primary winding 10 and the individual terminal points of the secondary winding 20 are represented by six capacitors in FIG. 2, whose capacitance value in each case corresponds to a component of the total capacitance C.

As a result of the symmetrical arrangement of the secondary windings 20_1, 20_2 with respect to the primary winding 10, the capacitive coupling between the first and second terminals 11, 12 of the primary winding 10 and the secondary winding 20_1, 20_2 is in each case the same. The parasitic coupling capacitance between the primary and secondary sides is thus distributed symmetrically between the terminals on the primary and secondary sides. During operation of the signal transmitter, as will be explained later, the secondary windings 20_1, 20_2 are connected via the reference-ground potential terminal 28 to a common reference-ground potential REFs on the secondary side, and a voltage between those terminals 21, 22 of the secondary windings 20_1, 20_2 which are remote from the reference-ground potential 28 is evaluated in order to determine a transmitted signal. Any common-mode interference signal which occurs on the primary side during operation such as this, that is to say a signal which acts on the first and second terminals 11, 12 of the primary winding 10 in the same manner, results in a corresponding common-mode signal on the secondary side, at the first and second terminals 21, 22 of the secondary winding, with respect to the respective reference-ground potential terminal 28 of the reference-ground potential REFs on the secondary side. A common-mode interference signal such as this can easily be identified as an interference signal, and can thus be eliminated, in a manner which will be explained later.

If the common reference-ground potential terminal 28 of the secondary windings is connected to a suitable reference-ground potential REFs on the secondary side during operation of the signal transmitter, then complementary signal profiles are in each case produced between the outputs 21, 22 of the secondary windings 20_1, 20_2 and the reference-ground potential REFs on the secondary side when the primary side of the transmitter is excited, as will be explained in the following text with reference to FIG. 3.

Figure 3:
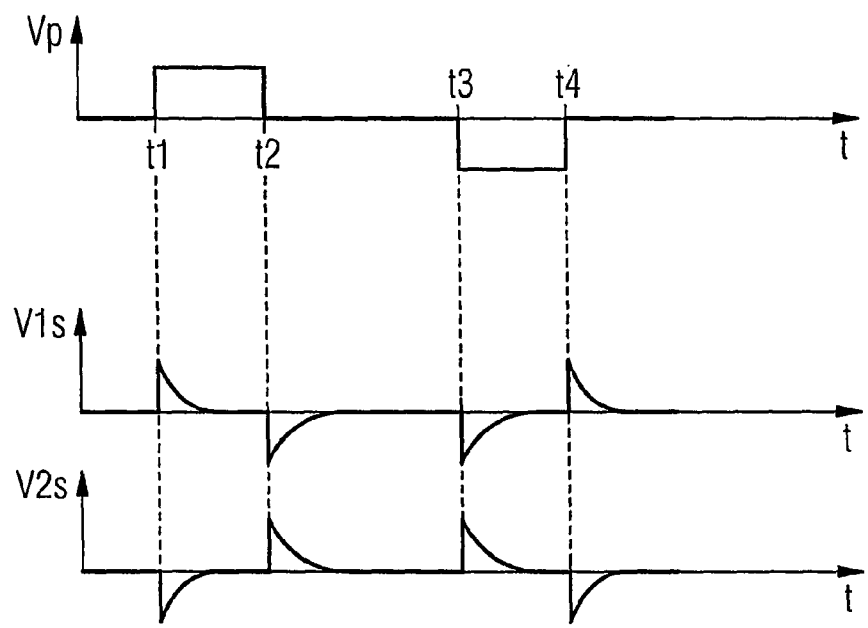
FIG. 3 explains one possible signal transmission method via the signal transmitter.

FIG. 3 shows time profiles of a first secondary voltage V1s between the first output terminal 21 and the reference-ground potential terminal 28, and a second secondary voltage V2s between the second output terminal 22 and the reference-ground potential terminal 28, for two different signal pulses applied to the primary side of the signal transmitter.

In either to explain the transmission behavior, it is assumed that a positive signal pulse or a negative signal pulse is applied for a time period on the primary side. A positive signal pulse is in this case equivalent to a positive signal pulse at the first terminal 11 with respect to a reference-ground potential REFp on the primary side, while the second terminal 12 is at the reference-ground potential REFp on the primary side. A negative transmission pulse is in this case equivalent to a positive signal pulse at the second input 12, while the first input 11 is at the reference-ground potential REFp on the primary side.

A positive signal pulse on the primary side, which has a rising edge at a time t1 and a falling edge at a time t2, as well as a negative signal pulse on the primary side, which has a falling edge at a time t3 that occurs after the time t2 and a rising edge at a time t4, are illustrated successively on the time axis in FIG. 3. The rising edge of the positive pulse at the time t1 leads to a positive signal pulse of the first secondary voltage Vs which decays exponentially over the rest of the profile, and to a negative signal pulse of the second secondary voltage V2s, whose amplitude decays exponentially over the rest of the profile. The negative edge at the time t2 of the positive signal pulse results in a negative pulse of the first secondary voltage V1s, whose amplitude decays exponentially over the rest of the profile, and a positive pulse of the second secondary pulse V2s, whose amplitude likewise decays exponentially over the rest of the profile. The positive and negative edges of the negative signal pulse lead to corresponding signal profiles of the first and second secondary voltages V1s, V2s, like the positive and negative flanks of the positive signal pulse.

The already explained method of operation of the signal transmitter is achieved by connecting individual winding sections 23_1-24_2 of one secondary winding 20_1, 20_2 to one another such that voltages which are induced in the individual winding sections 23_1-24_2 on excitation of the primary winding 10 are added. The first and the second secondary windings 20_1, 20_2 are in this case connected such that voltages of opposite polarity are induced in each of these secondary windings with respect to the reference-ground potential terminal. The voltages which are induced by the primary winding in the individual winding sections of the first secondary winding are thus added in the opposite sequence to the voltages which are induced by the primary winding in the individual winding sections of the second secondary winding. In geometric terms, this is equivalent to saying that a circular ring, which is formed by the winding sections 23_1, 24_1 of the first secondary winding 20_1, starting from the reference-ground potential terminal 28, runs to the terminal 11 in the opposite direction to a direction in which a circular ring which is formed by the winding sections 23_2, 24_2 of the second secondary winding 20_2, starting from the reference-ground potential terminal 28, runs to the terminal 12.

Figure 4:
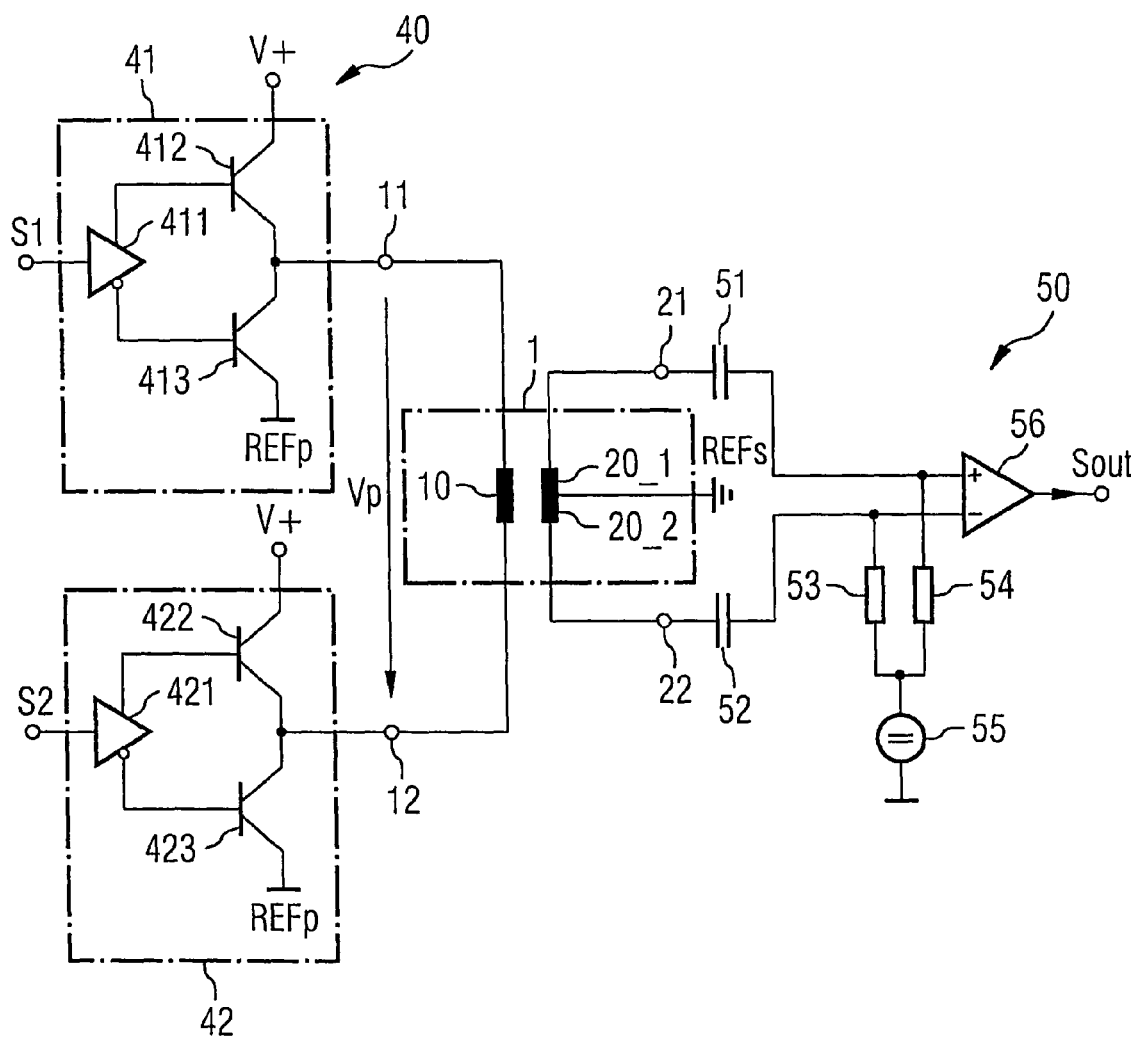
FIG. 4 shows a data transmission apparatus having a signal transmitter according to an example of at least one embodiment of the invention.

FIG. 4 shows a signal transmission apparatus having a signal transmitter 1 as already explained. The secondary windings 20_1, 20_2 in the case of this signal transmitter are connected to one another, and are jointly connected to the reference-ground potential REFs on the secondary side.

On the secondary side, the signal transmission apparatus has a receiving apparatus 50, which is connected to the outputs 21, 22 of the secondary windings 20_1, 20_2, which are connected to one another. This receiving apparatus 56 has a differential amplifier 56, which forms the difference between the secondary voltages (V1s, V2s in FIG. 2) applied to the outputs 21, 22, and produces an output signal Sout which is dependent on this difference. The inputs of the differential amplifier in this receiver are decoupled from the terminals 21, 22 of the secondary windings via capacitors 51, 52. These capacitors 51, 52 are used to provide DC decoupling between the outputs 21, 22 of the secondary windings and the inputs of the differential amplifier 56. The signal pulses (see FIG. 3) which are produced at the outputs 21, 22 for signal transmission are, however, transmitted through these capacitors 51, 52 to the inputs of the differential amplifier 56. A voltage source is also connected via resistors 53, 54 to the inputs of the differential amplifier and is used to set the operating point of the differential amplifier 56.

The time profile of an output signal Sout from the differential amplifier 56 corresponds, when the primary side of the signal transmitter 1 is excited as illustrated in FIG. 3, to the difference between the first secondary voltage signal V1s and the second secondary voltage signal V2s. Since these secondary voltages are in each case complementary to one another, the signal profile of the output signal Sout corresponds to the signal profile of the first secondary voltage Vs1, but with twice the amplitude. If the gain of the differential amplifier 56 is not equal to unity, then the output signal Sout is at an amplitude which corresponds to twice the signal amplitude of the secondary voltages Vs1, Vs2 multiplied by the gain of the differential amplifier 56.

Any common-mode interference signal which occurs on the primary side leads to the same secondary voltages Vs1, Vs2 with respect to the reference-ground potential REFs on the secondary side, because of the symmetrical configuration of the signal transmitter. The difference between these signals is zero, so that the output signal from the differential amplifier 56 is likewise zero when a common-mode interference signal occurs.

In a manner which is not illustrated in any more detail, an evaluation circuit having a threshold-value detector, which evaluates the output signal Sout from the differential amplifier in order to reconstruct the transmission signal Vp on the primary side may be connected downstream to the differential amplifier 56.

On the primary side, the signal transmission apparatus illustrated in FIG. 4 has a driver circuit 40 with two drivers 41, 42, a first driver 41 of which is connected to the first terminal 11 of the primary winding 10, and a second driver 42 is connected to the second terminal 12 of the primary winding 10. These two driver circuits 41, 42 are respectively designed to connect the terminals 11, 12 of the primary winding 10 to a positive supply voltage V+ or to the reference-ground potential REFp on the primary side, depending on a control signal S1, S2. The driver circuits 41, 42 each have a half-bridge circuit with two transistors 412, 413, 422, 423. The transistors in a driver circuit 41, 42 are in this case driven in a complementary form with respect to one another via a driver 411, 421 depending on the respective control signal S1, S2 such that only one transistor in the respective half-bridge is in each case switched on.

The method of operation of the driver circuit 40 illustrated in FIG. 4 will be explained in the following text using the signal sequence, as illustrated in FIG. 3, of the primary voltage Vp. In order to produce the positive signal pulse from the time t1, the first terminal 11 is connected via the first driver circuit 41 to the positive supply potential V+ from the time t1. For this purpose, the control signal S1 assumes, for example, a high level, as a result of which the upper transistor (high-side transistor) 412 in the half-bridge is switched on, while the lower transistor (low-side transistor) is switched off. At the time t2, the first terminal 11 is connected to the reference-ground potential REFp on the primary side, which is done by the control signal S1 at this time assuming a low level, at which the upper transistor 412 is switched off and the lower transistor 413 is switched on.

In order to produce the negative signal pulse from the time t3, the second terminal 12 is connected to the supply potential V+ at the time t3 via the second driver circuit 42, which is done by the second control signal S2 assuming a high level at this time. From the time t4, the second terminal 12 of the primary winding 10 is connected to the reference-ground potential REFp on the primary side, which is done by the second control signal S2 assuming a low level from this time.

FIG. 5 shows a further example of a signal transmitter according to at least one embodiment of the invention. This signal transmitter differs from the signal transmitter explained with reference to FIG. 1 in that the two secondary windings 20_1, 20_2 each have three series-connected winding sections, specifically the winding sections 23_1, 24_1, 25_1 for the first secondary winding 20_1 and the winding sections 23_2, 24_2, 25_2 for the second secondary winding 20_2. FIG. 5A shows a cross section through the primary winding 10 and the individual winding sections of the secondary windings 20_1, 20_2 of this signal transmitter 1. Two winding sections, one of which is associated with the first secondary winding 20_1 and the other of which is associated with the second secondary winding 20_2, in each case form a winding section pair, and are arranged in one winding level. The winding section pairs in the three winding levels are arranged one above the other in the first direction and are aligned with the primary winding 10 in this first direction.

Figure 5A:
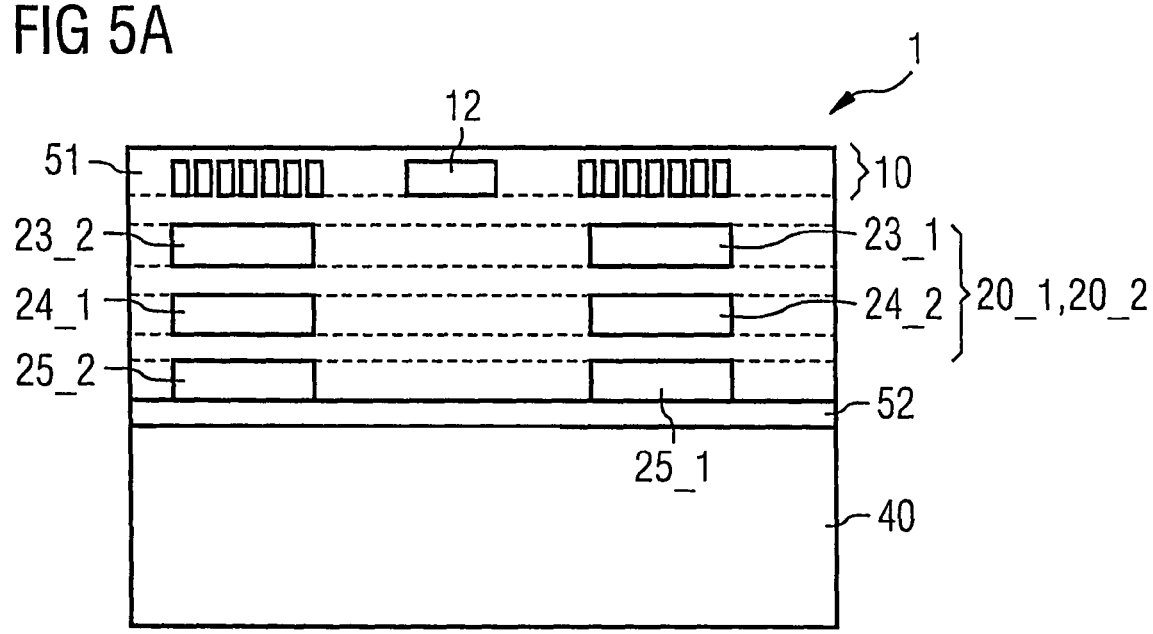
FIG. 5 shows a further example of a signal transmitter according to at least one embodiment of the invention.
Figure 5B:
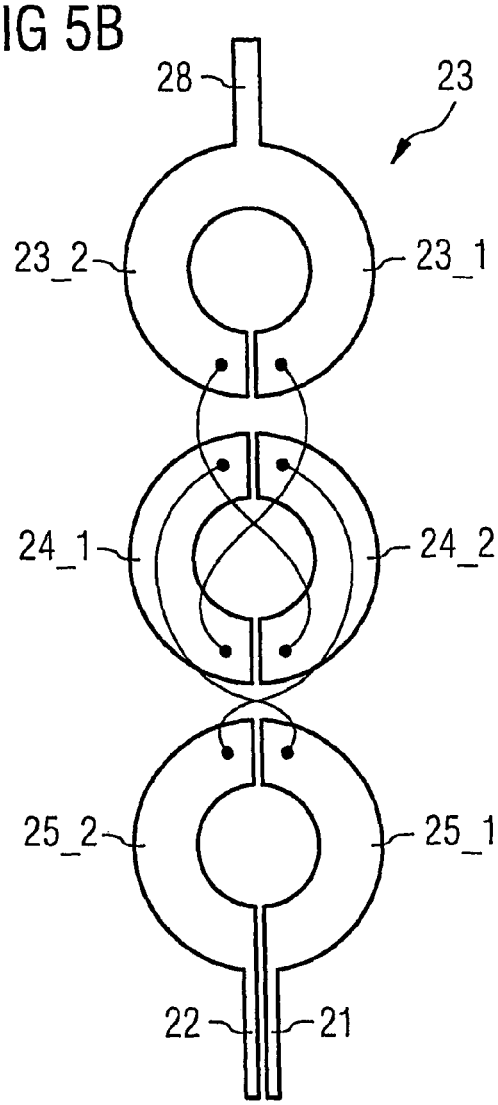

The geometry of the individual winding sections and their interconnection are shown in FIG. 5B, in which the individual winding sections are illustrated one above the other, starting with the winding sections 23_1, 23_2 in the winding level which is directly adjacent to the primary winding 10. The electrical connections of the individual winding sections are illustrated by connection lines, which are shown schematically, in FIG. 5B. The winding sections 23_1, 23_2 in the first winding level have a common reference-ground potential terminal 28 in this example, and are integrally connected to one another in the area of this reference-ground potential terminal 28.

Figure 5C:
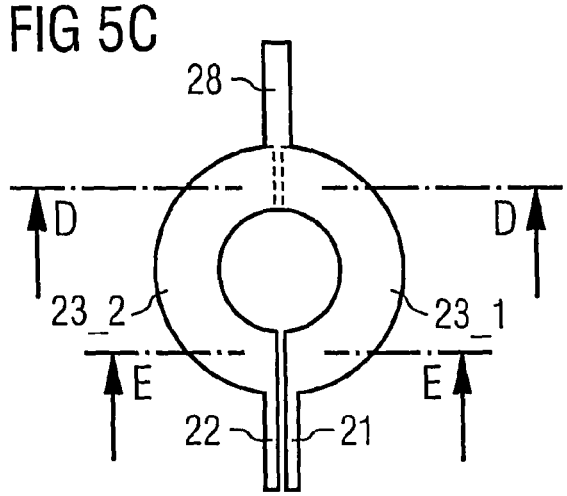
Figure 5D:
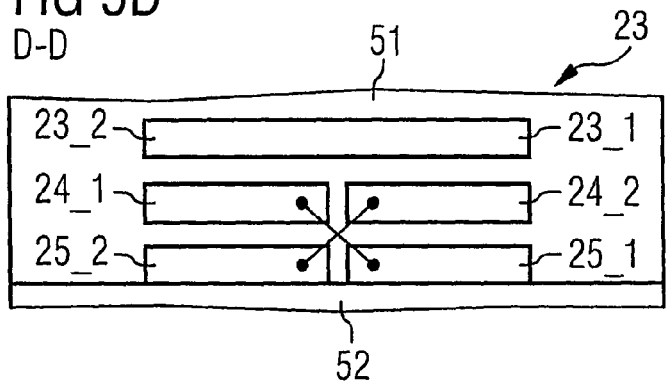
Figure 5E:
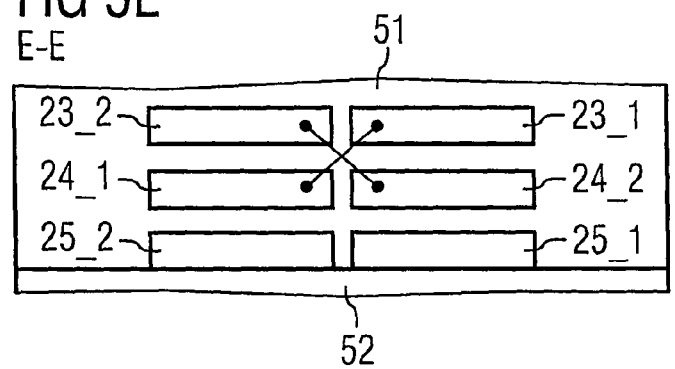

FIG. 5C shows a plan view of the winding sections, arranged one above the other, of the signal transmitter, and FIGS. 5D and 5E show cross sections through the section planes D-D and E-E illustrated in FIG. 5C. These cross sections show the signal transmitter in the areas in which the individual winding sections of one winding section pair are each separated from one another by gaps. These FIGS. 5D and 5E also schematically illustrate electrical connection lines between the individual winding sections, which are used to connect each of those sections which belong to one secondary winding in series. The winding sections which are associated with one secondary winding 20_1, 20_2 are in this case arranged offset with respect to one another in the second direction in the individual winding levels. In order to allow two such winding sections which are arranged offset with respect to one another to be electrically conductively connected to one another, the individual winding sections of the signal transmitter illustrated in FIG. 5 have tooth-like structures, corresponding to the winding sections of the signal transmitter illustrated in FIG. 1, with terminals which can be connected to one another via vertical connection lines, in a corresponding manner to the explanatory notes relating to FIGS. 1E and 1F.

Figure 5F:
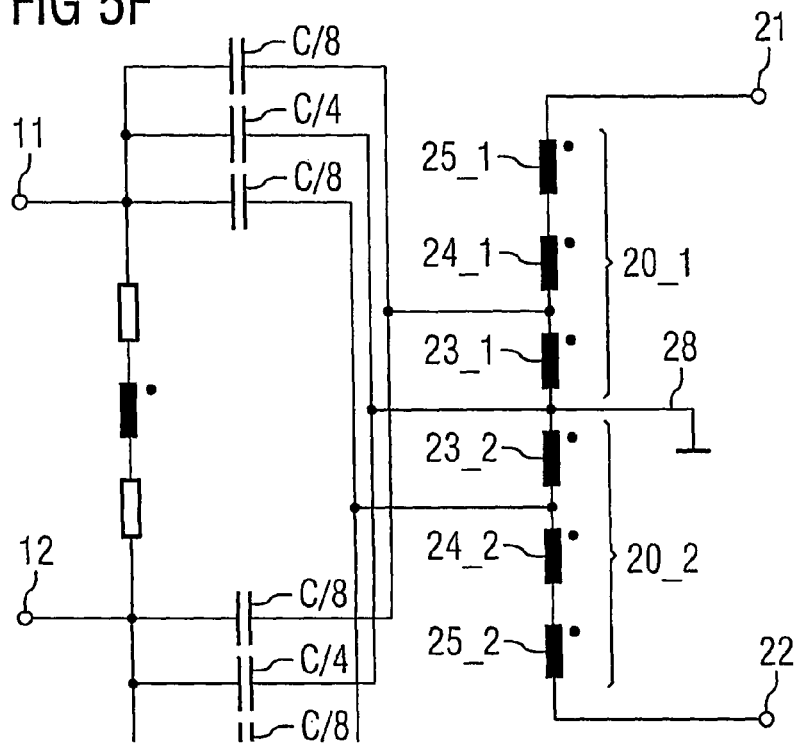

The electrical equivalent circuit of the signal transmitter which has been explained so far with reference to FIGS. 5A to 5E is illustrated in FIG. 5F. This equivalent circuit comprises six inductances, three of which are in each case connected in series between one of the secondary winding terminals 21, 22 and the reference-ground potential terminal 28. These three series-connected inductances each form one of the secondary windings 20_1, 20_2.

The signal transmitters which have been explained so far each have two secondary windings 20_1, 20_2, each of which in each case has at least two winding sections, with the individual winding sections being arranged in different winding levels. The winding sections of one secondary winding are in this case arranged offset with respect to one another in adjacent winding levels. Each of these winding sections forms half a turn, that is to say it covers an angle of 180°. In these signal transmitters, each of those winding sections which are associated with one secondary winding and are arranged in two adjacent winding levels are each arranged offset through 180° with respect to one another.

The concept explained above can also be used to provide signal transmitters with one primary winding and more than two secondary windings, with the individual secondary windings each being inductively coupled to the primary winding in the same way. In order to provide n (where n>2) secondary windings, each having one turn, n winding levels are in this case required, with n winding sections which each form an annular segment with an angle of 360°/n being provided in each winding level. In order to produce a secondary winding, n such winding sections are connected in series, with there being only one winding section in one winding level for each secondary winding. The individual winding sections of a secondary winding are in this case arranged offset with respect to one another from one winding level to another through an angle which corresponds to 360°/n.

Figure 6A:
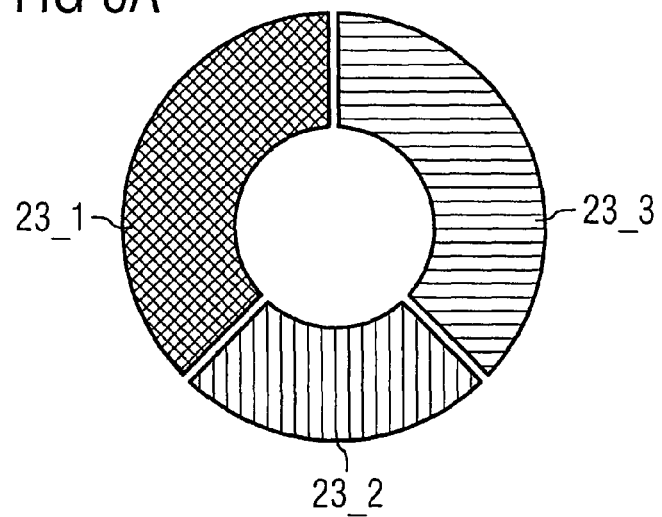
FIG. 6 shows an example of a signal transmitter in which three secondary windings are arranged in three winding levels.
Figure 6B:
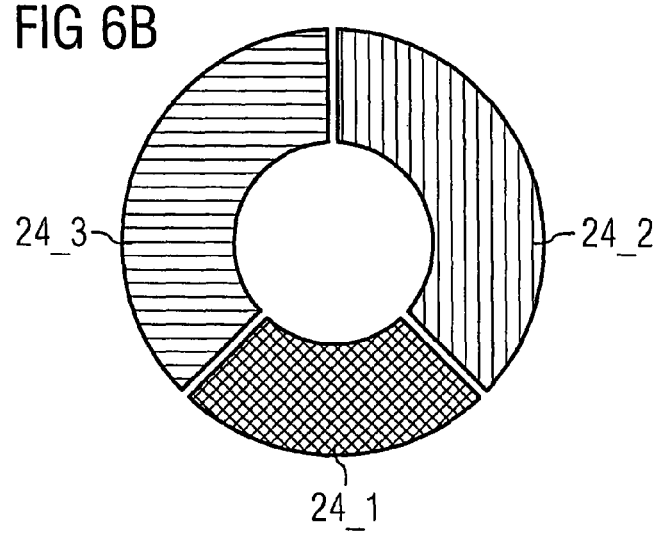
Figure 6C:
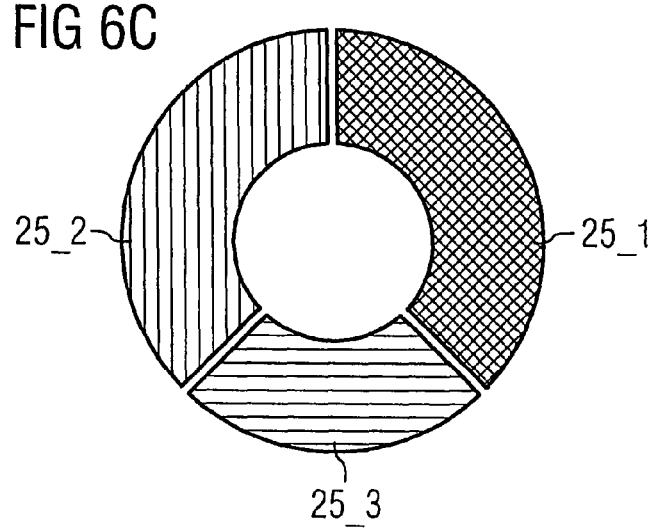

The secondary windings of a signal transmitter such as this having more than two secondary windings are illustrated for a signal transmitter having three secondary windings in FIGS. 6A to 6C.

FIG. 6A shows the winding sections in a first winding level which, for example, is arranged immediately adjacent to a primary winding (not illustrated). FIG. 6B shows the winding sections in a second winding level which is located immediately adjacent to the first winding level. FIG. 6C shows the winding sections in a third winding level, which is located immediately adjacent to the second winding level.

The individual winding sections form annular segments each having an angle of 120°, with the individual winding sections in one winding level being separated from one another by gaps which are filled with a dielectric (not illustrated). In a corresponding manner to the individual winding sections of the already explained signal transmitters, three winding sections are in each case arranged one above the other in the first direction, so that one winding section in one winding level is in each case located adjacent to one winding section in an adjacent winding level, and is aligned with this winding section in the adjacent winding level. A first of the three secondary windings is formed by a winding section 23_1 in the first winding level, a winding section 24_1 in the second winding level, and a winding section 25_1 in the third winding level. The winding section 24_1 in the second winding level is in this case offset through 120° counterclockwise with respect to the winding section 23_1 in the first winding level, and the winding section 25_1 in the third winding level is offset through 120° counterclockwise with respect to the winding section 24_1 in the second winding level. The second secondary winding is formed by winding sections 23_2, 24_2, 25_2, which are connected in series and are each offset counterclockwise through 120° with respect to one another from one winding level to another. In a corresponding manner, the third secondary winding is formed by winding sections 23_3, 24_3, 25_3, which are connected in series and are each offset counterclockwise through 120° with respect to one another from one winding level to another.

The winding sections in the various winding levels, which each form one secondary winding, are each illustrated by the same shading in FIGS. 6A to 6C. These winding sections may have tooth-like structures with terminals, in a manner which is not illustrated in any more detail, in order to allow two winding sections, which are arranged in adjacent winding levels, to be electrically connected to one another in the manner explained in FIGS. 1E and 1F.

In the signal transmitters which have been explained with reference to FIGS. 1 and 5, two antiphase secondary signals are available on the secondary side at the terminals 21, 22 with respect to the reference-ground potential REFs on the secondary side at the terminal 28. The two secondary windings 20_1, 20_2 in this case have the same coupling capacitances to the primary winding 10, and are inductively and/or magnetically coupled to the primary winding 10 in the same way, because of the symmetrical configuration of the signal transmitter. If common-mode interference signals occur on the primary side, the secondary signals are thus precisely the same and, in ideal circumstances, are not processed any further by a differential amplifier.

Figure 7A:
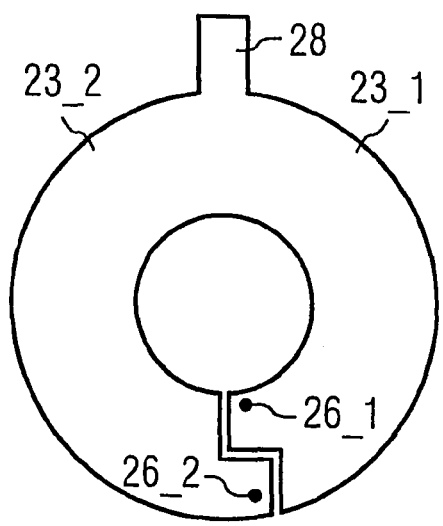
FIGS. 7A, 7B show secondary windings of an alternative embodiment of a signal transmitter according to the invention.
Figure 7B:
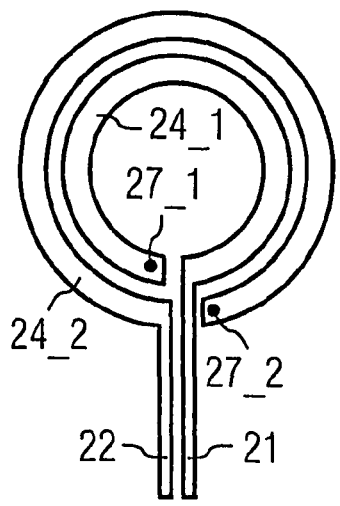

A further example for the provision of two secondary windings in a signal transmitter with one primary winding and two secondary windings is illustrated in FIGS. 7A and 7B. The primary winding, which is not illustrated, of this transmitter corresponds, for example, to the primary winding illustrated in FIG. 1B.

The secondary windings of this transmitter each comprise two winding sections 23_1, 24_1 and 23_2, 24_2, respectively, of which a first 23_1, 23_2 is in each case arranged in a first winding level, and a second 24_1, 24_2 is in each case arranged in a second winding level. FIG. 7A shows a plan view of the first winding sections 23_1, 23_2, which are arranged in the first winding level. FIG. 7B shows a plan view of the second winding sections 24_1, 24_2, which are arranged in the second winding level. The first winding sections 23_1, 23_2 are, for example, in the form of annular segments corresponding to the embodiments in FIGS. 1C and 5B, and have a common reference-ground potential terminal 28.

The two second winding sections 24_1, 24_2 in this arrangement are in the form of concentric open circular rings, that is to say they are not completely closed. Each of these circular rings has a terminal 27_1, 27_2 at one end. These connections 27_1, 27_2 are arranged such that they are located in the first direction respectively above and below a corresponding terminal 26_1, 26_2 of the associated first winding section 23_1, 23_2. The first winding sections 23_1, 23_2 may have a toothed structure in the area of the terminals, as illustrated. Ends of the circular rings 24_1, 24_2 which are opposite the ends with the terminals 27_1, 27_2 form output terminals 21, 22 of the seconding windings. Conductor sections which extend essentially parallel to one another away from the circular rings 24_1, 24_2 and allow contact to be made with the secondary windings in a simple manner are connected to the circular rings in these areas.

Figure 8A:
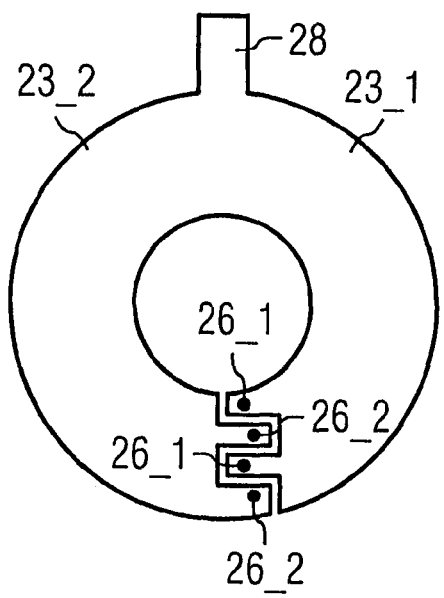
FIGS. 8A, 8B show secondary windings of another alternative embodiment of a signal transmitter according to the invention.
Figure 8B:
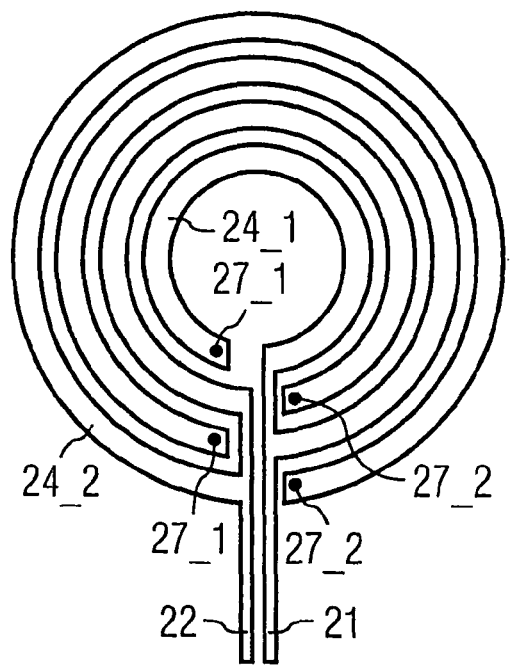

FIG. 8B illustrates a modification of the second winding sections illustrated in FIG. 7B. These second winding sections 24_1, 24_2 each a plurality of concentric open circular rings, in the example two of them. The circular rings of one winding section are in this case connected to one another at one end by means of a conductor section. These conductor sections form the output terminals 21, 22 of the secondary windings. The open circular rings of the second winding sections 24_1, 24_2 are arranged alternately starting from a common center, so that the circular rings of the two winding sections 24_1, 24_2 are "interleaved in one another".

At the ends with ends opposite the conductor sections, the circular rings each have terminals 27_1, 27_2 which are arranged such that, in the first direction, they are located respectively above and below a corresponding terminal 26_1, 26_2 of the associated first winding section 23_1, 23_2. The first winding sections 23_1, 23_2 may have a toothed structure in the area of the terminals, as illustrated.

With regard to magnetic coupling, the signal transmitters which have been explained with reference to FIGS. 7 and 8 are no longer exactly symmetrical with respect to the secondary outputs. The asymmetry with respect to the magnetic coupling is in this case less in the arrangement shown in FIG. 8 than in the arrangement shown in FIG. 7. The signal transmitters in FIGS. 7 and 8 are completely symmetrical with respect to the effect of the coupling capacitances between the primary and secondary windings.

The equivalent circuit of the signal transmitters in FIGS. 7 and 8 corresponds to that illustrated in FIG. 2, with the only difference being that the secondary inductances 24_1 and 24_2 are considerably greater than the inductances of the first winding sections 23_1 and 23_2.

What is claimed is:

1. A signal transmitter comprising:
   a primary winding;
   a first secondary winding and at least one second secondary winding, wherein the first secondary winding and the second secondary winding are arranged at a distance from the primary winding in a first direction and are in each case inductively coupled to the primary winding, wherein each of the first secondary winding and the second secondary winding includes at least two series-connected winding sections;
   wherein the at least two series-connected winding sections of each of the first secondary winding and the second secondary winding are arranged in at least two different winding levels; and
   wherein each of the first secondary winding and the at least one second secondary winding have an output terminal and a ground terminal, each output terminal being arranged at those winding sections of each of the first secondary winding and the second secondary winding that are arranged in that winding level of the at least two different winding levels which is most distant from the primary winding in the first direction.

2. The signal transmitter as claimed in claim 1, wherein the at least two series-connected winding sections of one of the first secondary winding or the at least one second secondary winding are arranged offset with respect to one another in a second direction in the at least two different winding levels.

3. The signal transmitter as claimed in claim 2,
   wherein each of the first secondary winding and the second secondary winding includes a first winding section which is arranged at distance from the primary winding in the first direction in a first winding level, and
   wherein each of the first secondary winding and second secondary winding includes a second winding section which is arranged at a distance from the first winding sections in the first direction in a second winding level.

4. The signal transmitter as claimed in claim 3, wherein each of the first secondary winding and the second secondary winding includes at least one further winding section which is arranged at a distance from the second winding level in at least one further winding level.

5. The signal transmitter as claimed in claim 1,
   wherein a first stack of winding sections is provided, the first stack of winding sections including winding sections of the first secondary winding and the second secondary winding alternately, starting from the primary winding, in the first direction; and
   wherein a second stack of winding sections is provided, the second stack of winding sections including winding sections of the second secondary winding and the first secondary winding alternately, starting from the primary winding, in the first direction, with the second stack being arranged adjacent to the first stack in the second direction.

6. The signal transmitter as claimed in claim 1, wherein the winding sections are in the form of annular segments.

7. The signal transmitter as claimed in claim 6, wherein the annular segments of one winding level each cover the same angular range.

8. The signal transmitter of claim 6, wherein the annular segments in one winding level each have the same area.

9. The signal transmitter as claimed in claim 6, wherein the annular segments in at least one winding level comprise a toothed structure with terminals at in each case one end.

10. The signal transmitter as claimed in claim 1, wherein, when a voltage is applied to the primary winding, voltages are induced in the individual winding sections of a secondary winding, and within which the winding sections of the first secondary winding and the at least one second secondary winding are connected such that the voltages induced by the primary winding in the individual winding sections of one secondary winding are added.

11. The signal transmitter of claim 10, wherein the winding sections of the first secondary winding and the at least one second secondary winding are connected such that the voltages induced in the individual winding sections of the first secondary winding are added in the opposite sequence to the voltages which are induced in the individual winding sections of the second secondary winding by the primary winding.

12. The signal transmitter as claimed in claim 3, wherein the first winding sections each have a reference-ground potential terminal, and each have one terminal via which the first winding sections are connected to the second winding sections.

13. The signal transmitter as claimed in claim 12, wherein the first winding sections are integrally connected to one another in the area of the reference-ground potential terminals.

14. The signal transmitter as claimed in claim 1, further comprising a mount substrate on which the winding sections are arranged.

15. The signal transmitter as claimed in claim 14, wherein the mount substrate is a semiconductor substrate.

16. The signal transmitter as claimed in claim 14, wherein the winding sections are arranged parallel to one surface of the mount substrate.

17. The signal transmitter as claimed in claim 1, wherein a dielectric layer is arranged between each of the winding levels of the secondary windings.

18. The signal transmitter as claimed in claim 1, wherein the winding sections are comprised of a metal.

19. The signal transmitter as claimed in claim 1, wherein the winding sections arranged in one winding level each have toothed structures which engage in one another in the area of the terminals.

20. The signal transmitter as claimed in claim 1,
wherein first winding sections which are arranged in a first winding level are in the form of annular segments which are arranged adjacent to one another in the first winding level, and
wherein second winding sections which are arranged in a second winding level each have at least one open circular ring, with the circular rings of the second winding sections being arranged concentrically.

21. The signal transmitter as claimed in claim 20, wherein each of the second winding sections includes at least two open circular rings, with the circular rings of a first of the winding sections and of a second of the winding sections being arranged alternately within the second winding level.

22. A signal transmission apparatus comprising:
a signal transmitter comprising,
a primary winding; and
a first secondary winding and at least one second secondary winding, wherein the first secondary winding and the second secondary winding are arranged at a distance from the primary winding in a first direction and are in each case inductively coupled to the primary winding, wherein each of the first secondary winding and the second secondary winding includes at least two series-connected winding sections;
wherein the at least two series-connected winding sections of each of the first secondary winding and the second secondary winding are arranged in at least two different winding levels;
wherein each of the first secondary winding and the at least one second secondary winding have an output terminal and a ground terminal, each output terminal being arranged at those winding sections of each of the first secondary winding and the second secondary winding that are arranged in that winding level of the at least two different winding levels which is most distant from the primary winding in the first direction;
a transmission circuit connected to the primary winding of the signal transmitter; and
a receiver circuit including a differential amplifier and connected to the secondary windings of the signal transmitter.

23. The signal transmission apparatus as claimed in claim 22,
wherein the transmission circuit includes a first driver circuit connected to a first terminal of the primary winding and configured to apply a first or second drive potential to the first terminal on the basis of a first transmission signal; and
wherein the transmission circuit includes a second driver circuit connected to a second terminal of the primary winding and configured to apply a first or second drive potential to the second terminal on the basis of a second transmission signal.

* * * * *